United States Patent
Sentoku

(10) Patent No.: US 8,618,515 B2
(45) Date of Patent: Dec. 31, 2013

(54) LITHOGRAPHY APPARATUS AND DEVICE MANUFACTURING METHOD

(75) Inventor: Koichi Sentoku, Kawachi-gun (JP)

(73) Assignee: Canon Kabushiki Kaisha (JP)

( * ) Notice: Subject to any disclaimer, the term of this patent is extended or adjusted under 35 U.S.C. 154(b) by 368 days.

(21) Appl. No.: 13/162,979

(22) Filed: Jun. 17, 2011

(65) Prior Publication Data

US 2011/0310373 A1 Dec. 22, 2011

(30) Foreign Application Priority Data

Jun. 18, 2010 (JP) .................... 2010-139945

(51) Int. Cl.
  *G21G 1/10* (2006.01)
  *H01J 37/08* (2006.01)
  *G02B 27/42* (2006.01)
  *H01J 37/317* (2006.01)
  *G03F 9/00* (2006.01)
  *G03F 7/20* (2006.01)

(52) U.S. Cl.
  CPC ........... *H01J 37/3174* (2013.01); *G03F 9/7053* (2013.01); *G03F 7/2059* (2013.01)
  USPC .......... 250/492.22; 430/296; 355/53

(58) Field of Classification Search
  CPC ... G03F 9/7011; G03F 9/7019; G03F 9/7053; G03F 7/2059; B82Y 10/00; B82Y 40/00; H01J 37/3174; H01J 37/3177
  USPC ............ 250/492.2–492.3; 378/34; 356/401; 430/296; 355/53, 67, 77
  See application file for complete search history.

(56) References Cited

U.S. PATENT DOCUMENTS

| | | | | |
|---|---|---|---|---|
| 4,996,434 A * | 2/1991 | Tanaka | ................ | 250/492.3 |
| 5,837,423 A * | 11/1998 | Okamoto | ................ | 430/296 |
| 6,027,843 A * | 2/2000 | Kojima et al. | ................ | 430/30 |
| 6,072,184 A * | 6/2000 | Okino et al. | ................ | 250/492.2 |
| 6,137,111 A * | 10/2000 | Yamada et al. | ................ | 250/492.2 |
| 6,222,197 B1 * | 4/2001 | Kojima | ................ | 250/492.22 |
| 6,512,237 B2 * | 1/2003 | Nakasugi et al. | ................ | 250/491.1 |
| 6,559,456 B1 * | 5/2003 | Muraki | ................ | 250/491.1 |
| 6,583,413 B1 * | 6/2003 | Shinada et al. | ................ | 850/9 |
| 6,630,681 B1 * | 10/2003 | Kojima | ................ | 250/492.22 |
| 7,304,320 B2 * | 12/2007 | Nagano | ................ | 250/492.22 |
| 7,361,898 B2 * | 4/2008 | Mizuno et al. | ................ | 250/331 |
| 7,411,191 B2 * | 8/2008 | Nakasuji et al. | ................ | 250/310 |
| 7,423,274 B2 * | 9/2008 | Nakayama et al. | ................ | 250/491.1 |
| 7,880,143 B2 * | 2/2011 | Tanimoto et al. | ................ | 250/310 |

(Continued)

FOREIGN PATENT DOCUMENTS

JP  2000-133566 A  5/2000

*Primary Examiner* — Steven H Whitesell Gordon

(74) *Attorney, Agent, or Firm* — Rossi, Kimms & McDowell LLP

(57) ABSTRACT

A lithography apparatus includes a first measurement device which measures a position of a mark on a substrate with light, a second measurement device which measures a position of a reference mark on a stage with a charged-particle, a detector which detects the position of the stage in a first direction parallel to the axis of a projection system and a second direction perpendicular to this axis, and a controller. The controller determines a charged-particle beam, in which the angle, with respect to the first direction, at which it is incident on the reference mark falls within a tolerance, and obtains a baseline for the first measurement device from the position of the reference mark measured by the second measurement device using the determined charged-particle beam and the position of the reference mark measured by the first measurement device.

5 Claims, 9 Drawing Sheets

(56) References Cited

U.S. PATENT DOCUMENTS

| | | |
|---|---|---|
| 2002/0028399 A1* | 3/2002 | Nakasuji et al. ............. 430/30 |
| 2007/0023654 A1* | 2/2007 | Kamimura et al. .......... 250/310 |
| 2009/0001267 A1* | 1/2009 | Enyama et al. .............. 250/310 |
| 2010/0209831 A1* | 8/2010 | Choi et al. .................... 430/30 |
| 2011/0204228 A1* | 8/2011 | Tsuno et al. .................. 250/310 |
| 2011/0253892 A1* | 10/2011 | Yamaguchi .................. 250/307 |
| 2011/0310373 A1* | 12/2011 | Sentoku ......................... 355/67 |
| 2013/0171570 A1* | 7/2013 | Sentoku et al. ............... 430/296 |

* cited by examiner

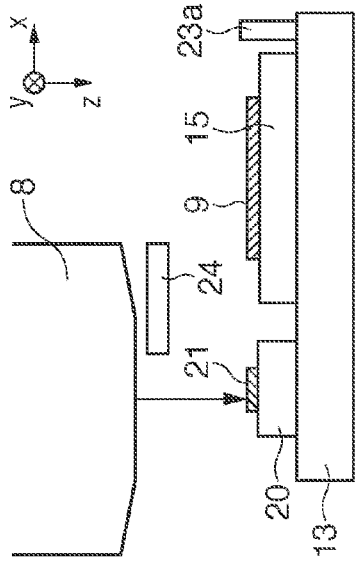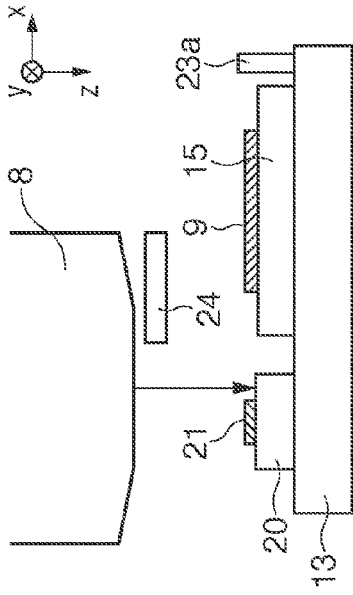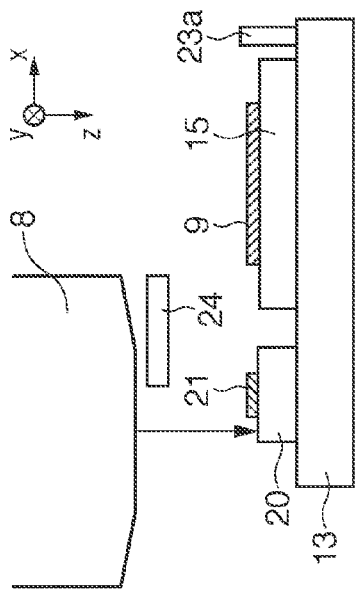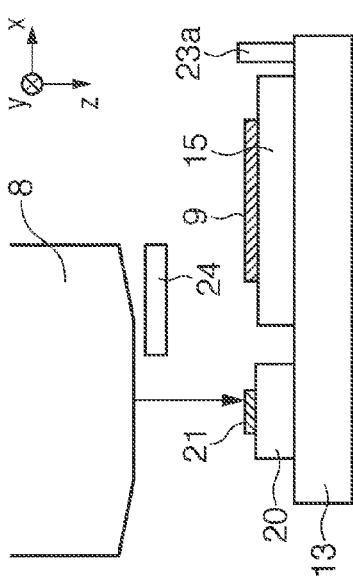

LITHOGRAPHY APPARATUS AND DEVICE MANUFACTURING METHOD

BACKGROUND OF THE INVENTION

1. Field of the Invention

The present invention relates to a lithography apparatus which uses a plurality of charged-particle beams, and a method of manufacturing a device.

2. Description of the Related Art

When an electron-beam exposure apparatus is used to draw the device pattern of the (n+1)th layer on the device pattern of the nth layer formed on the wafer, the device patterns of the nth and (n+1)th layers are aligned. For the alignment (overlay), wafer alignment measurement is performed. In the wafer alignment measurement, the positions of a plurality of alignment marks already formed on the wafer by exposure are measured using an off-axis alignment scope, and the positions of all shots formed on the wafer by exposure are obtained based on the measured values. In this way, the position of each shot formed in the nth layer on the wafer is obtained, and thereupon this shot is moved to the electron-beam exposure position to draw by overlay exposure the device pattern of the (n+1)th layer on the pattern drawn in the nth layer. At this time, positioning of each shot is controlled based on the length of a baseline which connects the position of the alignment mark measured by the alignment scope and the electron-beam exposure position. Positioning of each shot is also controlled based on global alignment measurement values.

A baseline is a line (line segment) which connects the optical axis of the alignment scope and the electron-beam exposure position, indicates their relative positional relationship, and can be represented by a two-dimensional vector quantity. Baseline measurement is performed in accordance with the following procedure.

(1): The position of a reference mark formed on a reference mark table on a wafer stage is measured using the alignment scope.

(2): The position of the reference mark formed on the reference mark table on the wafer stage is measured using the electron beam.

(3): A baseline that is the difference (relative positional relationship) between the position of the alignment mark on the wafer measured using the alignment scope and that of the alignment mark on the wafer measured using the electron beam is calculated based on the difference between the positions of the wafer stage in measurement which uses the alignment scope and the electron beam, respectively.

Japanese Patent Laid-Open No. 2000-133566 proposes a technique of measuring a baseline in an electron-beam exposure apparatus having a single electron beam (to be simply referred to as a single beam hereinafter).

A multibeam electron-beam exposure apparatus which uses a large number of electron beams to improve the throughput has been proposed. When an electron beam is used for baseline measurement in a multibeam electron-beam exposure apparatus, as in a single-beam electron-beam exposure apparatus, it is necessary to select an electron beam, to be used to detect the position of the reference mark, from a plurality of electron beams. The inventor of the present invention found that depending on which one of a plurality of electron beams is used to detect the position of the reference mark, the incident angle of the electron beam on the reference mark changes, so the detection precision of the position of the reference mark and consequently the baseline measurement precision also change. This holds true not only for an exposure apparatus which uses a plurality of electron beams but also for a general lithography apparatus which uses a plurality of charged-particle beams.

SUMMARY OF THE INVENTION

The present invention provides a lithography apparatus, which uses a plurality of charged-particle beams, advantageous in terms of a precision of a baseline measurement.

The present invention provides a lithography apparatus including a stage which includes a reference mark and configured to hold a substrate, a projection system configured to project a plurality of charged-particle beams onto the substrate, a first measurement device configured to irradiate a mark on the substrate with a light and to detect a light reflected by the mark to measure a position of the mark, a second measurement device configured to irradiate the reference mark with a charged-particle beam via the projection system and to detect a charged-particle beam that reaches the second measurement device from the reference mark to measure a position of the reference mark, and a detector configured to detect a position of the stage in a first direction parallel to an axis of the projection system and a second direction perpendicular to the axis, the apparatus drawing a pattern on the substrate with the plurality of charged-particle beams, the apparatus comprising: a controller configured to determine, among the plurality of charged-particle beams, a charged-particle beam of which an incident angle, relative to the first direction, on the reference mark falls within a tolerance, and to obtain a baseline of the first measurement device based on a position of the reference mark measured by the second measurement device using the determined charged-particle beam and a position of the reference mark measured by the first measurement device.

The present invention in its second aspect provides a method of manufacturing a device, the method comprising: drawing a pattern on a substrate using the lithography apparatus; developing the substrate on which the pattern has been drawn; and processing the developed substrate to manufacture the device.

Further features of the present invention will become apparent from the following description of exemplary embodiments with reference to the attached drawings.

BRIEF DESCRIPTION OF THE DRAWINGS

FIGS. 5A to 5D are views showing a method of measuring reflected secondary electrons;

DESCRIPTION OF THE EMBODIMENTS

[First Embodiment]

Figure 2:
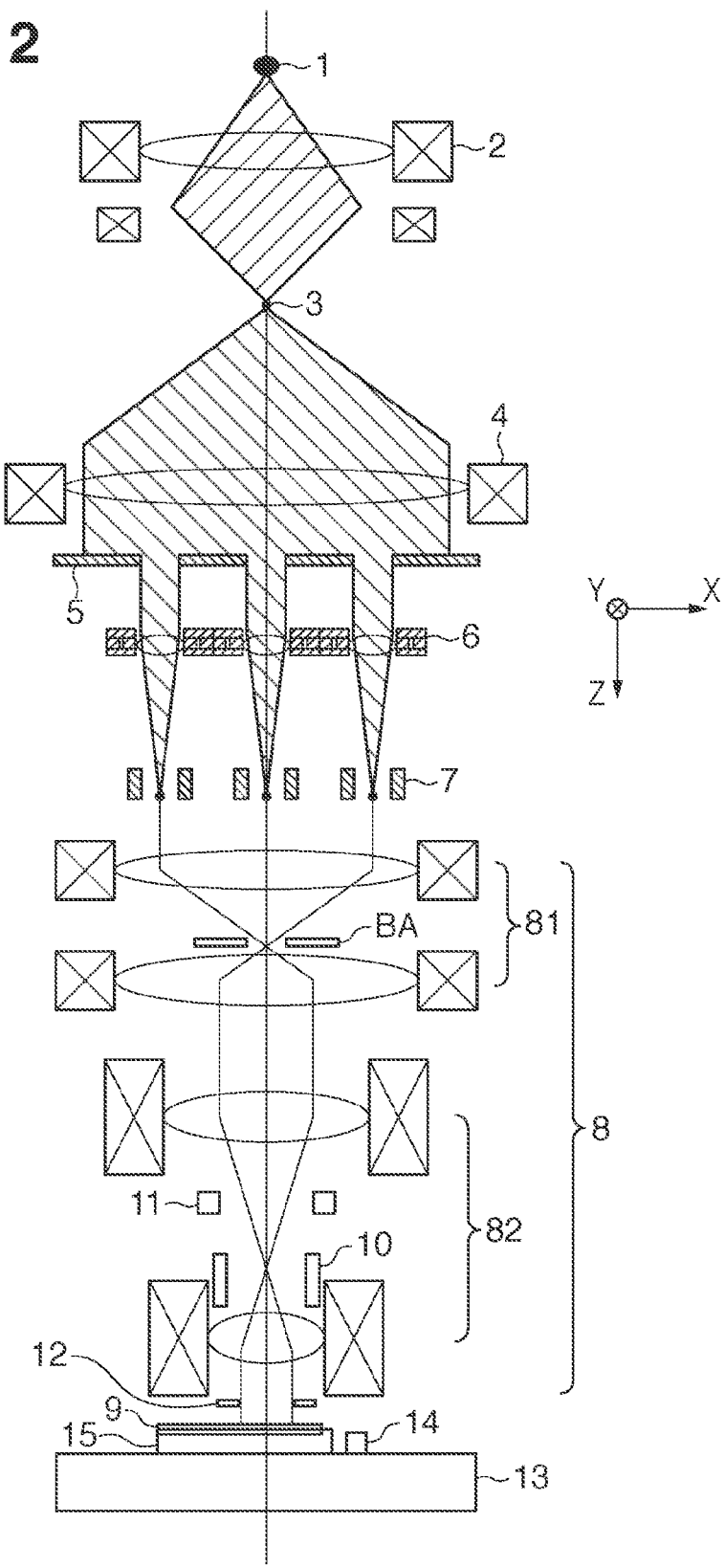
FIG. 2 is a view showing an electron-beam exposure apparatus.

Although the present invention is applicable to a general lithography apparatus which uses a plurality of charged-particle beams, an example in which it is applied to a lithography apparatus (exposure apparatus) which uses a plurality of electron beams will be described below. FIG. 2 is a schematic view showing the arrangement of a multibeam electron-beam exposure apparatus which uses a plurality of electron beams. Referring to FIG. 2, an electron beam emitted by an electron source 1 forms an image 3 of the electron source 1 via an optical system 2 for shaping the beam. The electron beam from the image 3 is converted into a nearly collimated electron beam by a collimator lens 4. The nearly collimated electron beam passes through an aperture array 5. The aperture array 5 has a plurality of apertures and splits the electron beam into a plurality of electron beams. The plurality of electron beams split by the aperture array 5 form intermediate images of the image 3 by an electrostatic lens array 6 formed from a plurality of electrostatic lenses. A blanker array 7 formed from a plurality of blankers serving as electrostatic deflectors is located on the intermediate image plane. A reduced electron optical system (projection system) 8 including two-stage symmetrical magnetic doublet lenses 81 and 82 is located downstream of the intermediate image plane, and projects the plurality of intermediate images onto a wafer (substrate) 9. The reduced electron optical system 8 serves as an electron optical system which has an axis in the Z direction (first direction) and forms images of the plurality of electron beams on the surface of the substrate.

An electron beam deflected by the blanker array 7 is shielded by a blanking aperture BA and therefore does not impinge on the wafer 9. On the other hand, an electron beam which is not deflected by the blanker array 7 is not shielded by the blanking aperture BA and therefore impinges on the wafer 9. A deflector 10 and focus coil 12 are located in the lower doublet lens 82. The deflector 10 simultaneously displaces the plurality of electron beams to desired positions in the X and Y directions (second direction). The focus coil 12 simultaneously adjusts the focuses of the plurality of electron beams. A wafer stage (stage) 13 holds the wafer 9 and can move in the X and Y directions perpendicular to the axis of the reduced electron optical system 8. An electrostatic chuck 15 for fixing the wafer 9 in position is placed on the wafer stage 13. A detector 14 including a knife edge measures the shape of the electron beam at the position of the irradiation surface of the wafer 9. A stigmator 11 adjusts the astigmatism (astigmatic aberration) of the reduced electron optical system 8.

Figure 1A:
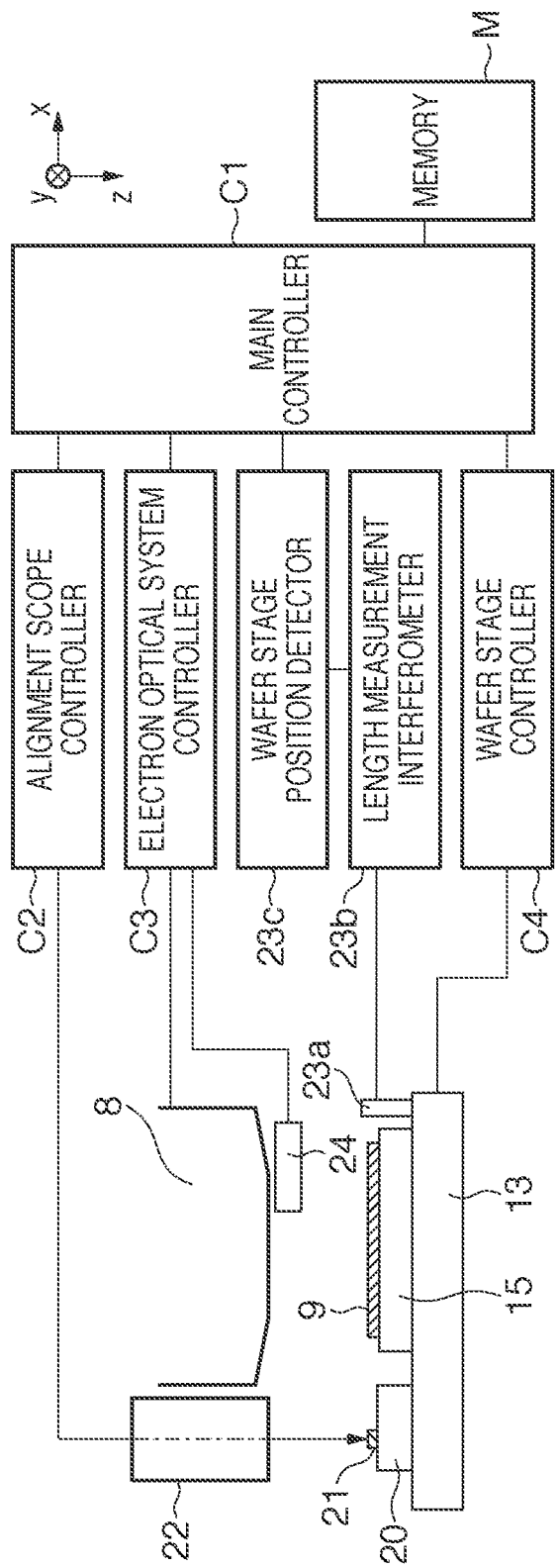
FIGS. 1A and 1B are views showing a method of measuring a baseline.
Figure 1B:
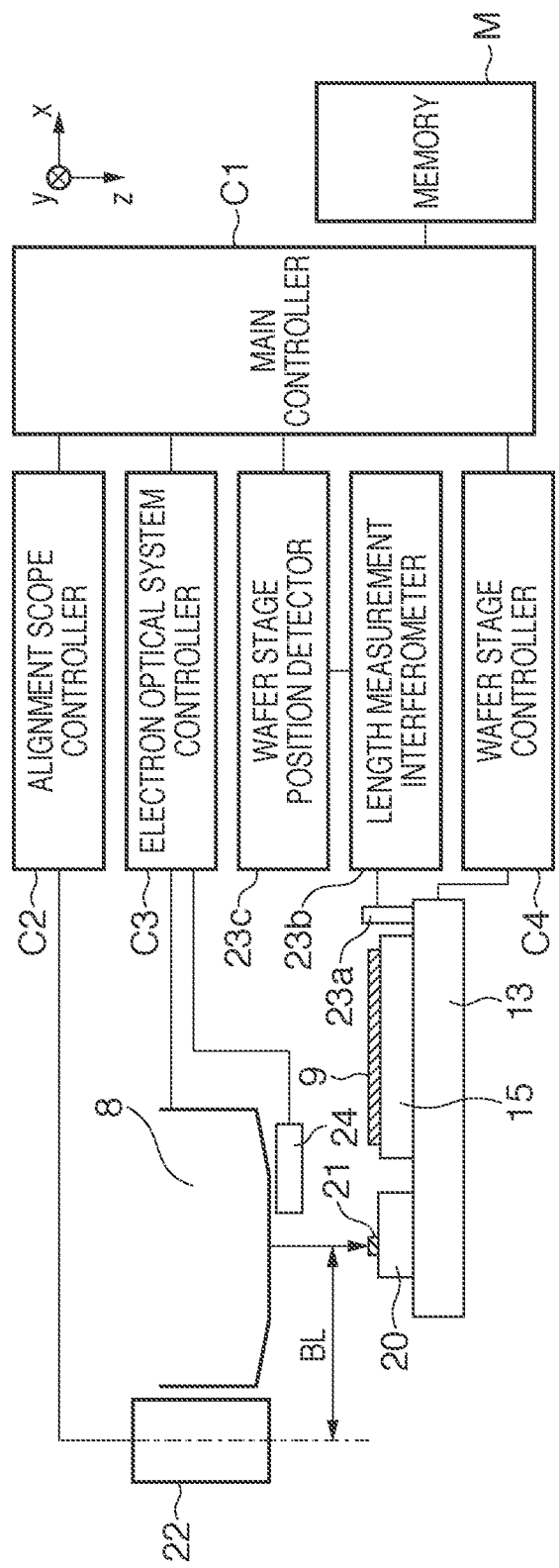

The wafer stage 13 moves by a step-and-repeat or step-and-scan operation. Patterns are drawn at a plurality of shot positions on the substrate by the electron beam while deflecting it simultaneously with the movement of the wafer stage 13. To draw a pattern on the substrate mounted on the wafer stage 13 while deflecting the electron beam, it is necessary to measure a reference position for the electron beam relative to the wafer stage 13. This reference position is measured in the following way using an off-axis alignment scope and an electron beam. FIGS. 1A and 1B are enlarged views of the vicinity of the wafer 9 in the electron-beam exposure apparatus shown in FIG. 2. Referring to FIG. 1A, a reference mark table 20 is placed on the wafer stage 13, and a reference mark 21 is formed on the reference mark table 20.

An image of the reference mark 21 is detected by an off-axis alignment scope 22, and an image signal is processed by an alignment scope controller C2, thereby specifying the position of the reference mark 21 relative to the optical axis of the alignment scope 22. At this time, a position P1 of the wafer stage 13 measured by a length measurement interferometer 23b including a mirror 23a placed on the wafer stage 13 is defined as P1=(X0,Y0) and stored in a memory M via a main controller C1. The alignment scope 22 serves as a first measurement device which irradiates the reference mark 21 with light, and detects reflected light of the irradiating light, thereby measuring the position of the reference mark 21. The length measurement interferometer 23b serves as one detector which detects the position of the wafer stage 13 in the Z direction (first direction) of the wafer stage 13 and the X and Y directions (second direction) perpendicular to the axis of the reduced electron optical system 8.

Figure 3:
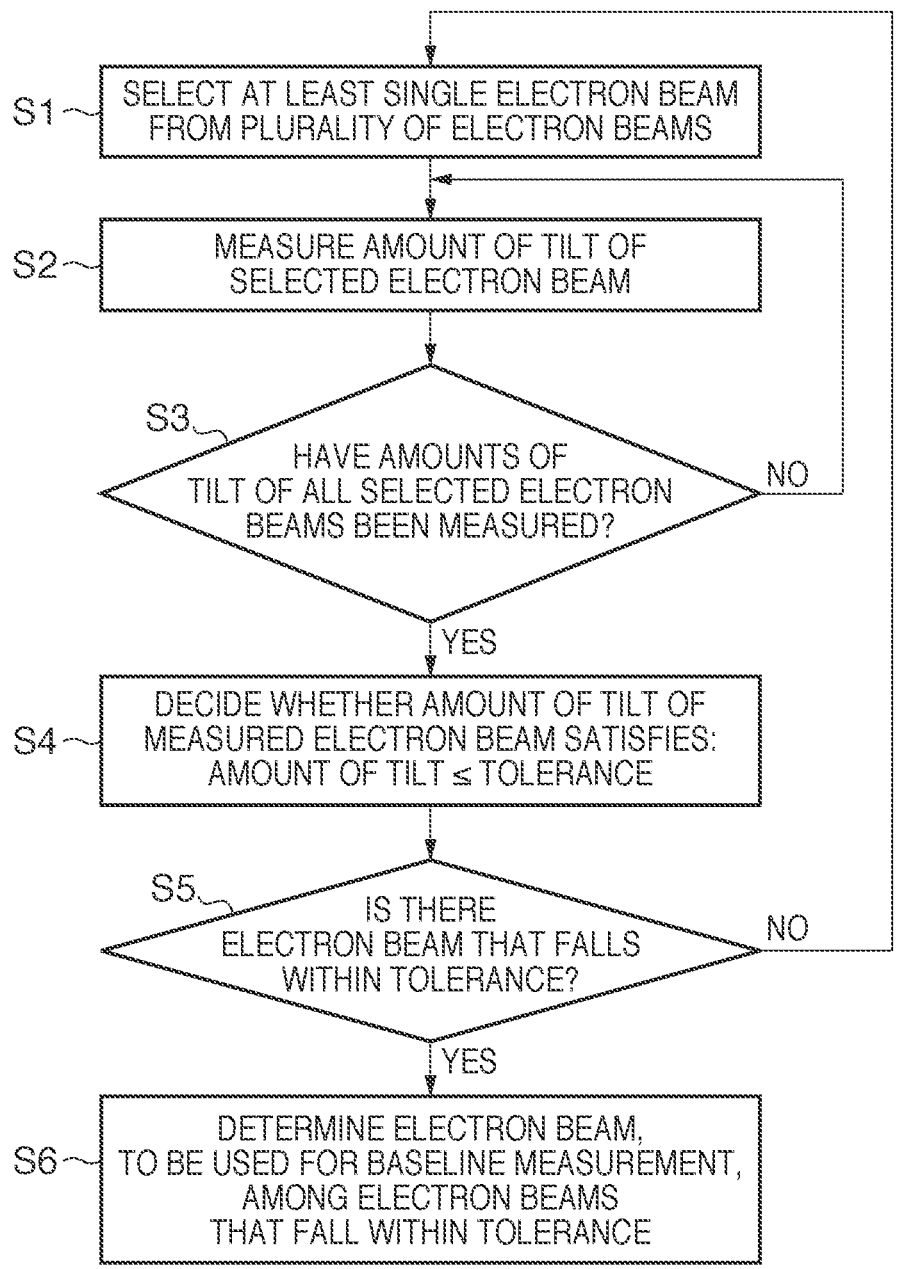
FIG. 3 is a flowchart for explaining a method of determining an electron beam to be used for baseline measurement.
Figure 4:
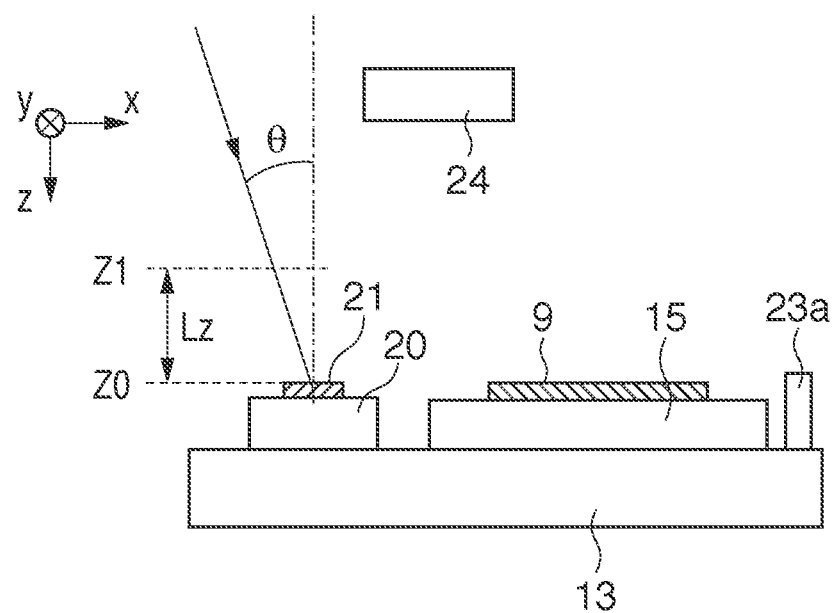
FIG. 4 is a view showing a method of measuring the amount of tilt of an electron beam.

Next, as shown in FIG. 1B, the reference mark 21 is moved to the electron-beam exposure position to measure the position of the reference mark 21 by the electron beam. An electron beam detector (second measurement device) 24 detects secondary electrons emitted by the reference mark 21 upon irradiating the reference mark 21 with an electron beam via the reduced electron optical system 8, thereby measuring the position of the reference mark 21. A method of determining an electron beam to be used to measure the position of the reference mark 21 will be explained with reference to a flowchart shown in FIG. 3. In step S1, the main controller C1 selects at least a single electron beam, to be used to detect the position of the reference mark 21, from a plurality of electron beams, and an electron optical system controller C3 adjusts the deflector so that only the selected electron beam reaches the surface of the reference mark 21. In step S2, the main controller C1 obtains an amount of tilt (an angle with respect to the first direction) θ of the electron beam, incident on the reference mark 21 selected in step S1, with respect to the Z-axis. As shown in FIG. 4, the main controller C1 drives the wafer stage 13 by a known amount in the Z direction while the reference mark 21 is irradiated with the electron beam, thereby moving the reference mark 21 in the Z direction. The electron beam detector 24 detects the X-direction positions of the reference mark 21, irradiated with the electron beam, at Z-direction positions Z0 and Z1 of the reference mark 21 before and after movement. For example, the amount of tilt θ of the electron beam is calculated by:

$$\theta = (Xz1 - Xz0)/Lz \tag{1}$$

where Lz is the distance between the Z-direction positions Z0 and Z1, X z0 is the X-direction position of the reference mark 21 measured at the Z-direction position Z0, and X z1 is the X-direction position of the reference mark 21 measured at the Z-direction position Z1.

Figure 6:
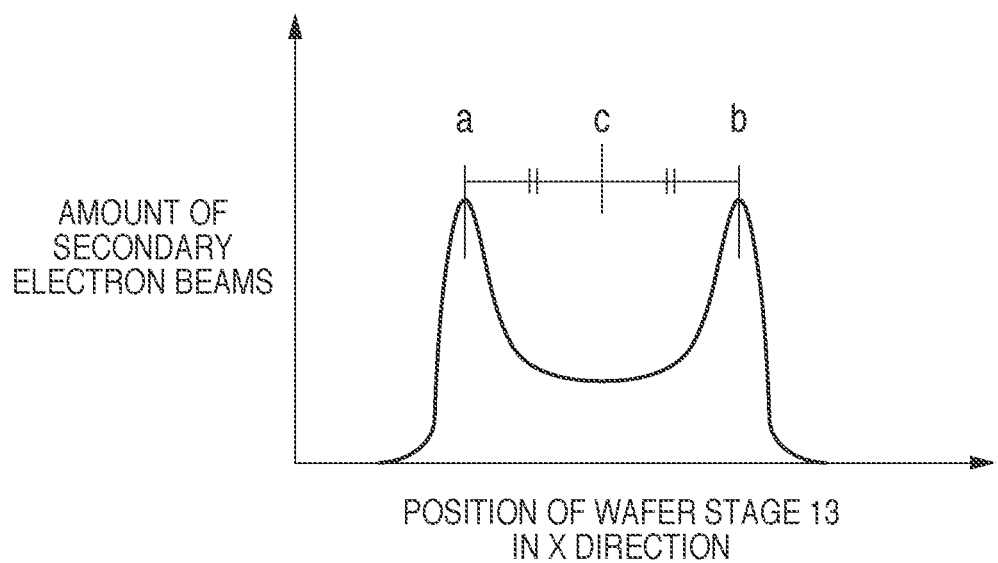
FIG. 6 is a graph showing the measurement result of the reflected secondary electrons.

A method of measuring the X-direction position of the reference mark 21 relative to the electron beam at each Z-direction position will be explained with reference to FIGS. 5A to 5D. The sequence from a process shown in FIG. 5A to that shown in FIG. 5D via FIGS. 5B and 5C presents the state in which the electron beam scans the surface of the reference mark 21 upon driving the wafer stage 13 in the X direction. The electron beam detector 24 detects reflected secondary electrons obtained from the reference mark 21 and its vicinity while the wafer stage controller C4 scans the wafer stage 13 in the X direction. FIG. 6 shows the detection result of reflected secondary electrons detected by the electron beam detector 24 when the wafer stage 13 is driven in the X direction. When the edge portions of the reference mark 21 at its two ends are irradiated with the electron beam, the amount of detection of reflected secondary electrons has peak shapes. A midpoint position c between two X-direction positions a and b of the wafer stage 13, at each of which the amount of detection of reflected secondary electrons has a peak, is determined as the position of the reference mark 21 relative to the electron beam, based on a change (FIG. 6) in amount of detection of reflected secondary electrons, which has two peak shapes obtained at that time. Also, a differential waveform of the detection result shown in FIG. 6 may be obtained, and two inflection points in a differential waveform region corresponding to the vicinities of the positions of the two peaks may be obtained, thereby determining the midpoint position between the two inflection points as the position of the reference mark 21. Moreover, the electron optical system controller C3 may control the deflector 10 to scan the surface of the reference mark 21 in the X direction using the electron beam while the wafer stage 13 is fixed in position, thereby detecting the position of the reference mark 21. The main controller C1 stores the thus measured amount of tilt θ of the electron beam in the memory M. The position of the reference mark 21 relative to the electron beam measured at this time may be determined as the position of the reference mark 21, to be obtained in step S26 (to be described later). In step S3, the main controller C1 decides whether the amounts of tilt θ of all selected electron beams have been measured. If NO is decided in step S3, the process returns to step S2; otherwise, the process advances to step S4.

In step S4, the main controller C1 decides whether the amount of tilt θ of the electron beam measured in step S2 falls within a predetermined tolerance. Letting E be the control residual (positioning precision) of the wafer stage 13 upon driving it in the Z direction, and A be the target precision of baseline measurement, the tolerance for the amount of tilt θ of the electron beam is (A/E). Note that A/E is the upper limit of the amount of tilt (absolute value) θ of the electron beam. Hence, the main controller C1 decides whether the amount of tilt (absolute value) θ of the electron beam satisfies:

$$\theta \leq A/E \tag{2}$$

If it is decided in step S5 that there is no electron beam having an amount of tilt θ that falls within the tolerance, the process returns to step S1, in which the main controller C1 selects at least one different electron beam. If it is decided in step S5 that there is an electron beam having an amount of tilt θ that falls within the tolerance, the process advances to step S6. In step S6, the main controller C1 determines an electron beam, to be used to measure the position of the reference mark 21, among electron beams each having an amount of tilt θ that falls within the tolerance. The main controller C1 measures the position of the reference mark 21 using the determined electron beam, and stores, in the memory M, a position P2 of the wafer stage 13 measured by the length measurement interferometer 23b at that time. The main controller C1 calculates the difference between the position P1 of the wafer stage 13 measured by the length measurement interferometer 23b when the reference mark 21 is measured by the alignment scope 22 and the position P2 of the wafer stage 13 measured by the length measurement interferometer 23b when the reference mark 21 is measured by the electron beam, and defines the calculated difference as a baseline.

When baseline measurement is performed using the above-mentioned method, no measurement error due to factors associated with the amount of tilt of the electron beam adversely affects the measurement precision, thus making it possible to improve the overlay precision in electron-beam exposure. Although measurement of a baseline in the X direction has been described for the sake of descriptive simplicity, measurement of a baseline in the Y direction can similarly be done. Also, an example in which an electron beam to be used for baseline measurement and measurement of the amount of tilt of the electron beam as some types of alignment measurement is determined has been described in the first embodiment. However, an electron beam to be used for baseline measurement may be determined by measuring the amount of tilt of an electron beam in advance before alignment measurement or while, for example, the electron-beam exposure apparatus does not perform a drawing operation.

[Second Embodiment]

Figure 7:
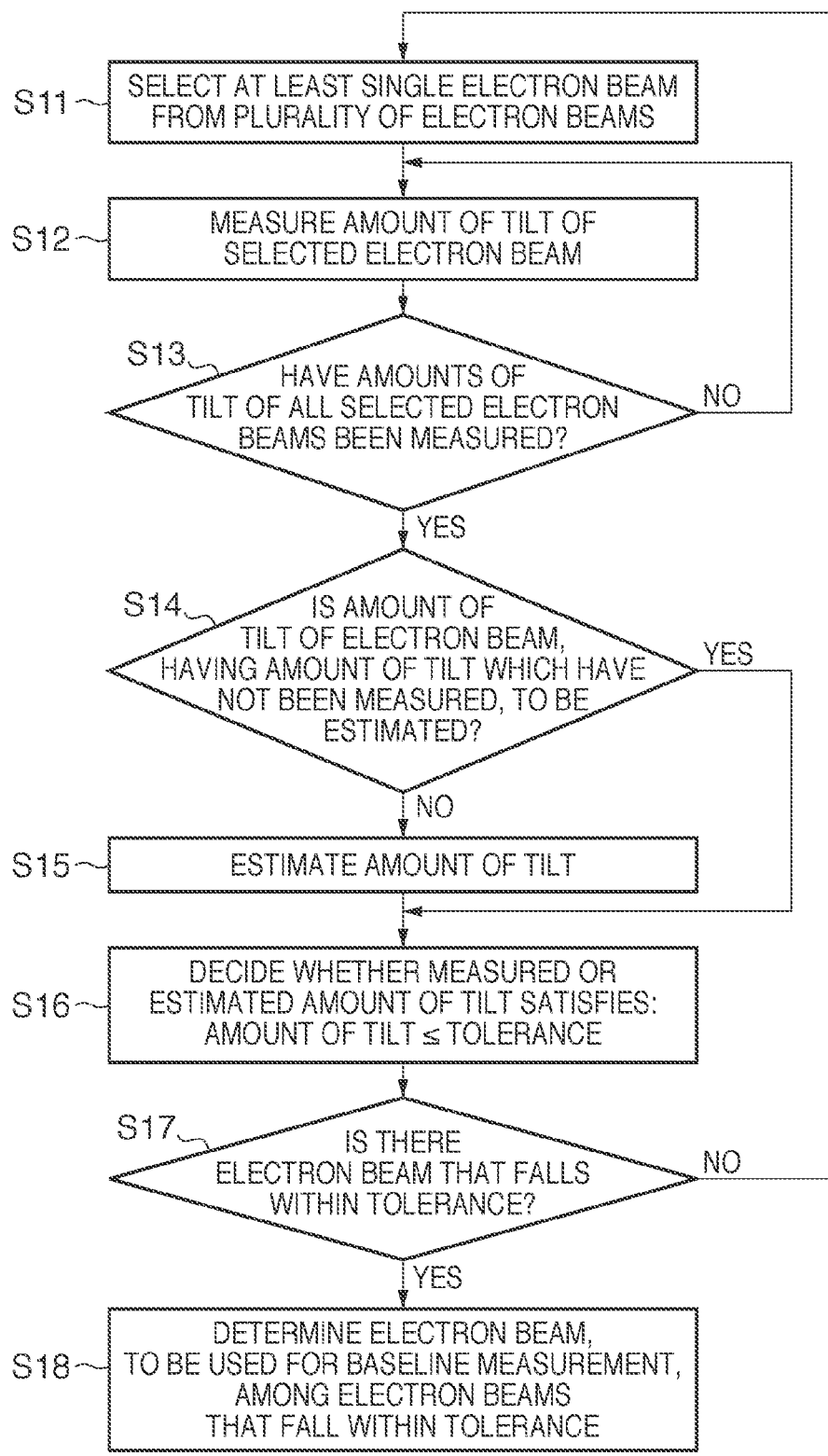
FIG. 7 is a flowchart for explaining another method of determining an electron beam to be used for baseline measurement.

Another method of determining an electron beam to be used for baseline measurement will be described with reference to a flowchart shown in FIG. 7. In step S11, a main controller C1 selects an electron beam that becomes a candidate for detecting the position of a reference mark 21 from a plurality of electron beams, and adjusts a deflector 10 so that only the selected electron beam reaches the surface of the reference mark 21. Note that a plurality of electron beams or all electron beams provided in an electron-beam exposure apparatus may be selected as candidates instead of selecting only a single electron beam. In step S12, the main controller C1 measures an amount of tilt θ of the electron beam, selected in step S11, with respect to the Z driving axis of a wafer stage 13. In step S13, the main controller C1 checks in step S13 whether amounts of tilt θ of all selected electron beams have been measured. If all electron beams have been measured, the main controller C1 advances the process to step S14. In step S14, the main controller C1 decides whether to obtain an amount of tilt θ of an electron beam which is not selected in step S11, based on the amount of tilt θ measured in step S12. If all electron beams have been selected in step S11 and their amounts of tilt θ have been measured in step S12, the process advances to step S16.

In step S15, the main controller C1 uses interpolation, extrapolation, or an approximation to estimate an amount of tilt θ of the remaining electron beam which is not selected in step S11, based on the amount of tilt θ measured in step S12. In step S16, the main controller C1 decides whether the amount of tilt θ of the electron beam obtained by measurement or estimation falls within a tolerance. If it is decided in step S17 that there is no electron beam having an amount of tilt θ that falls within the tolerance, the process returns to step S11, in which the main controller C1 selects at least one, different electron beam or controls the deflector 10 to reset the direction in which the electron beam is deflected. If it is decided in step S17 that there is an electron beam having an amount of tilt θ that falls within the tolerance, the process advances to step S18. When the amount of tilt of the electron beam decided to fall within the tolerance is an estimated value obtained by interpolation, extrapolation, or an approximation, the amount of tilt may be confirmed by actual measurement using the method described with reference to FIG. 4, in order to confirm the actual amount of tilt.

In step S18, the main controller C1 decides an electron beam, to be used for baseline measurement, among electron beams that fall within the tolerance.

[Third Embodiment]

Figure 8:
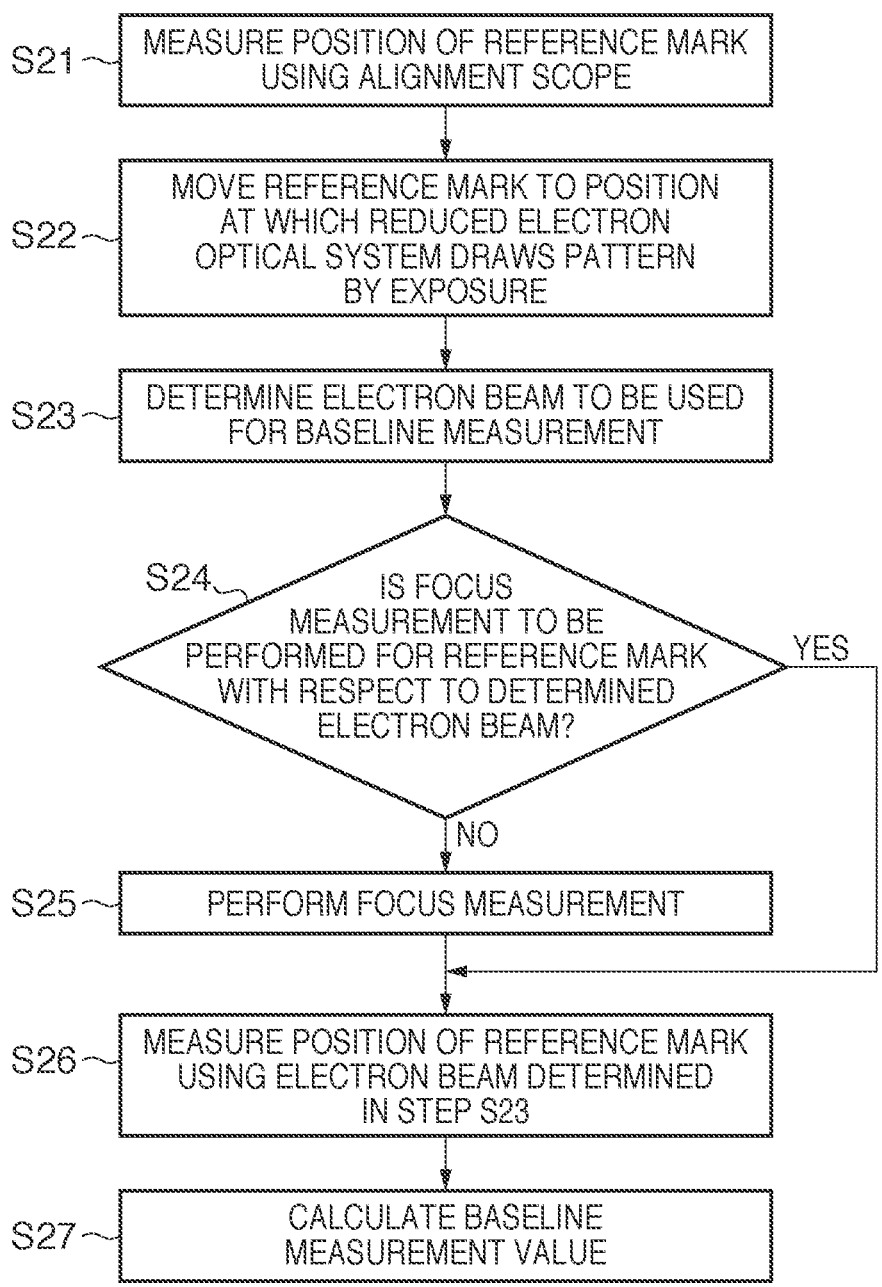
FIG. 8 is a flowchart for explaining a method of measuring a baseline.

FIG. 8 is a flowchart showing baseline measurement. In step S21, the position of a reference mark 21 is measured by an alignment scope 22. The arrangement of an exposure apparatus in step S21 is the same as that shown in FIG. 1A. In step S22, a wafer stage controller C4 moves the reference mark 21 to the position at which a reduced electron optical system 8 draws a pattern by exposure. The arrangement of the exposure apparatus in step S22 is the same as that shown in FIG. 1B. In step S23, a main controller C1 determines an electron beam to be used to measure the position of the reference mark 21. As a method of determining an electron beam, the method described in the first or second embodiment is employed.

In step S24, the main controller C1 decides whether to measure the focus position of the reference mark 21 with respect to the electron beam determined in step S23. If the amount of tilt of the electron beam falls within a tolerance, the process may skip the next step S25 and directly advance to step S26, in which the position of the reference mark 21 is measured by the electron beam. Also, if the amount of tilt of the electron beam falls within the tolerance, the process may directly advance to step S27 upon deciding that both decision in step S24 and focus measurement in step S25 are unnecessary.

If it is decided in step S24 that focus measurement is to be performed, the main controller C1 performs focus measurement in step S25. For example, in the arrangement shown in FIG. 1B, the reference mark 21 is irradiated with the electron beam while scanning the electron beam on it, and the amount of reflected secondary electrons obtained in conformity with the shape of the reference mark 21 is detected by an electron beam detector 24, thereby performing focus measurement. This measurement is equivalent to pattern shape measurement which uses a so-called SEM. This shape measurement is performed at a plurality of Z positions by changing the position of the reference mark 21 in the Z direction. Among the obtained shape measurement results, the Z position at which the image contrast generated by the electron beam is highest is defined as a best focus position. In step S26, the main controller C1 measures the position of the reference mark 21 using the determined electron beam. In step S27, the main controller C1 calculates a baseline. The main controller C1 serves as a controller which determines an electron beam to be used to calculate a baseline and calculates a baseline from the difference between the measurement result of the reference mark 21 obtained using the determined electron beam and that of the reference mark 21 obtained using the alignment scope 22.

When an electron-beam exposure apparatus draws a device pattern using a plurality of electron beams, their amounts of tilt are often measured in order to improve the drawing precision. In this case, it may be decided using the measured values whether the amount of tilt of an electron beam falls within a tolerance presented in inequality (2).

[Method of Manufacturing Device]

A method of manufacturing a device according to an embodiment of the present invention is suitable for manufacturing devices such as a semiconductor device and an FPD. The method can include a step of exposing a substrate, coated with a photosensitive agent, using the above-mentioned electron-beam exposure apparatus, and a step of developing the substrate exposed in the exposing step. The method of manufacturing a device can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-139945 filed Jun. 18, 2010, which is hereby incorporated by reference herein in its entirety.

What is claimed is:

1. A lithography apparatus including a stage which includes a reference mark and configured to hold a substrate, a projection system configured to project a plurality of charged-particle beams onto the substrate, a first measurement device configured to irradiate a mark on the substrate with a light and to detect a light reflected by the mark to measure a position of the mark, a second measurement device configured to irradiate the reference mark with a charged-particle beam via the projection system and to detect a charged-particle beam that reaches the second measurement device from the reference mark to measure a position of the reference mark, and a detector configured to detect a position of the stage in a first direction parallel to an axis of the projection system and a second direction perpendicular to the axis, the apparatus drawing a pattern on the substrate with the plurality of charged-particle beams, the apparatus comprising:
a controller configured to determine, among the plurality of charged-particle beams, a charged-particle beam of which an incident angle, relative to the first direction, on the reference mark falls within a tolerance, and to obtain a baseline of the first measurement device based on a position of the reference mark measured by the second measurement device using the determined charged-particle beam and a position of the reference mark measured by the first measurement device.

2. The apparatus according to claim 1, wherein the controller is configured, with respect to each of at least a part of the plurality of charged-particle beams, to perform a movement of the stage in the first direction, and to obtain the incident angle based on positions of the reference mark respectively measured by the second measurement device before and after the movement.

3. The apparatus according to claim 1, wherein the controller is configured, with respect to each of at least a part of the plurality of charged-particle beams, to perform a movement of the stage in the first direction, and to obtain the incident angle based on positions of the reference mark respectively measured by the second measurement device before and after the movement, and is configured, with respect to each of remaining charged-particle beams of the plurality of charged-particle beams, to estimate the incident angle based on the obtained angles.

4. The apparatus according to claim 1, wherein an upper limit of an absolute value of the incident angle which defines the tolerance is (A/E), where E is a positioning precision of the stage with respect to the movement, and A is a target precision with which the baseline is obtained.

5. A method of manufacturing a device, the method comprising:
drawing a pattern on a substrate using a lithography apparatus defined in claim 1;
developing the substrate on which the pattern has been drawn; and
processing the developed substrate to manufacture the device.

* * * * *